United States Patent
Kato et al.

[11] Patent Number: 5,834,992
[45] Date of Patent: Nov. 10, 1998

[54] LC RESONANT PART WITH A VIA HOLE INDUCTOR DIRECTLY CONNECTED TO THE GROUND ELECTRODE

[75] Inventors: Noboru Kato; Atsushi Tojyo; Koji Nosaka, all of Kyoto-fu, Japan

[73] Assignee: Murata Manufacturing Co., Ltd., Nagaokakyo, Japan

[21] Appl. No.: 774,367

[22] Filed: Dec. 27, 1996

[30] Foreign Application Priority Data

Dec. 28, 1995 [JP] Japan ................................... 7-343039

[51] Int. Cl.⁶ .................................................... H03H 5/00
[52] U.S. Cl. ........................................... 333/185; 336/200
[58] Field of Search .................................. 333/184, 185; 336/200

[56] References Cited

U.S. PATENT DOCUMENTS

| | | | |
|---|---|---|---|
| 4,758,808 | 7/1988 | Sasaki et al. | 333/185 |
| 5,140,497 | 8/1992 | Kato et al. | 361/321 |
| 5,404,118 | 4/1995 | Okamura et al. | 333/185 X |
| 5,493,259 | 2/1996 | Blalock et al. | 333/182 |
| 5,652,561 | 7/1997 | Inoh et al. | 336/200 |

FOREIGN PATENT DOCUMENTS

| | | |
|---|---|---|
| 2 302 450 | 1/1997 | United Kingdom . |
| 2 303 495 | 2/1997 | United Kingdom . |

Primary Examiner—Robert J. Pascal
Assistant Examiner—Justin P. Bettendorf
Attorney, Agent, or Firm—Burns, Doane, Swecker & Mathis, LLP

[57] ABSTRACT

An LC resonant device effectively limits radiated noise and provides a high Q-value. In one embodiment, the LC resonant device comprises a laminated LC filter formed of: two insulating sheets having a first ground electrode and a second ground electrode formed on their respective surfaces; an insulating sheet having a third ground electrode on its surface and having a through hole formed in its central portion and connected to the third ground electrode; at least one insulating sheet having a through hole formed in its central portion; two insulating sheets having first and second capacitor electrodes on their surfaces respectively; and a cover insulating sheet. The through holes form an inductive conductor perpendicular to the capacitor electrodes. At least, one of the three ground electrodes is connected directly to the inductive conductor and the other ground electrodes are not directly connected to the inductive conductor.

22 Claims, 4 Drawing Sheets

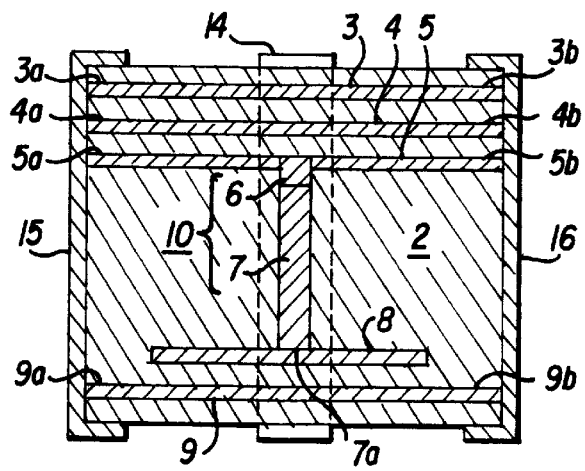
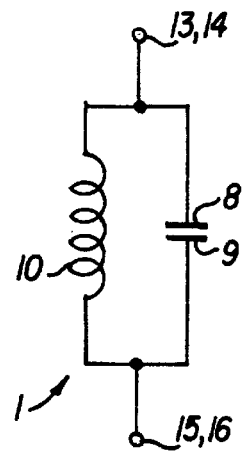
FIG. 3
FIG. 4
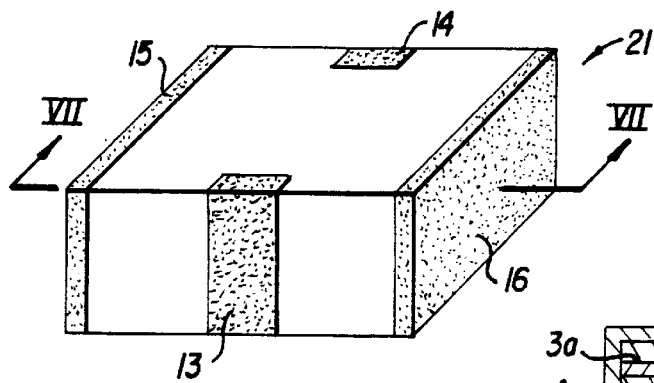
FIG. 6
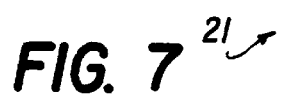
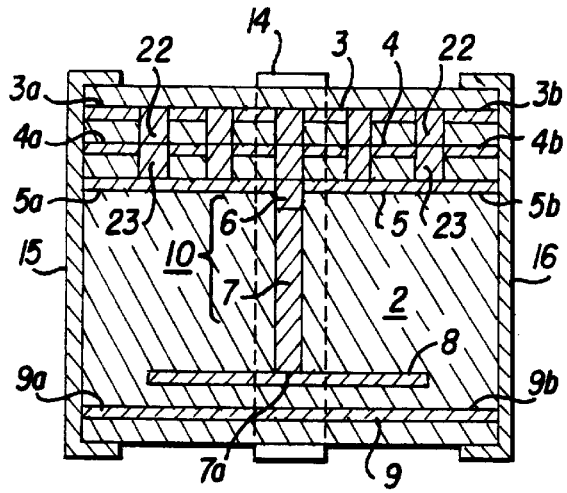
FIG. 7
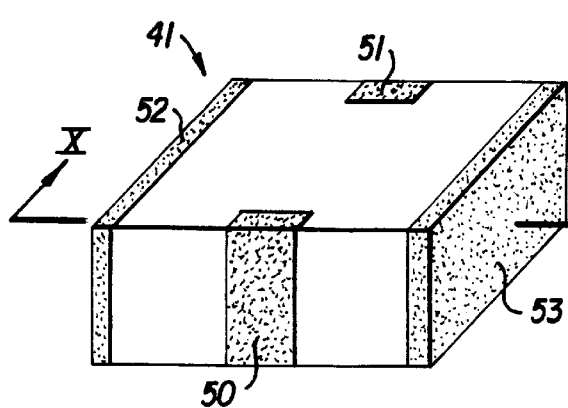
FIG. 9

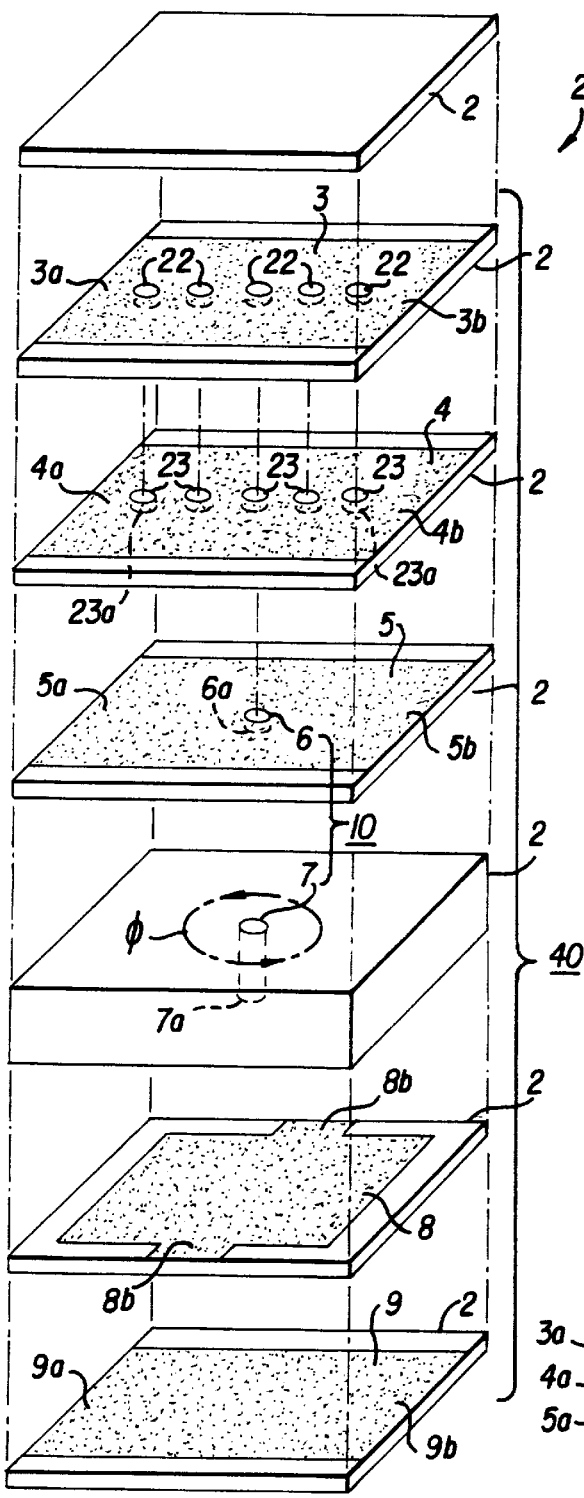
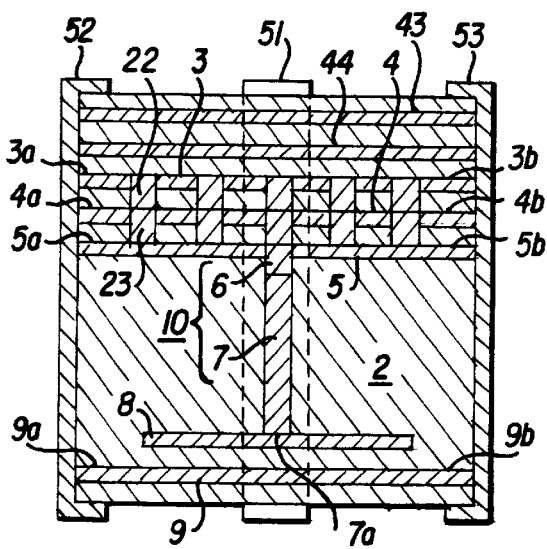
FIG. 5
FIG. 10

5,834,992

LC RESONANT PART WITH A VIA HOLE INDUCTOR DIRECTLY CONNECTED TO THE GROUND ELECTRODE

BACKGROUND OF THE INVENTION

1. Field of the Invention

The present invention relates generally to LC resonant devices and, more particularly, to a laminated type LC resonant device for use in a high-frequency apparatus such as a portable telephone set.

2. Description of the Related Art

Conventional LC (inductance-capacitance) filter 80 shown in FIG. 11 has an integral structure in which an insulating sheet 81 with a ground electrode 82, an insulating sheet 81 with a spiral inductor conductor 83 (henceforth, "inductive conductor"), an insulating sheet 81 with a capacitor electrode 84, an insulating sheet 81 with a capacitor electrode 85, and an insulating sheet 81 having no conductor on its surface are laminated together. The inductive conductor 83 and the capacitor electrode 84 are electrically connected to each other by a through hole 86 (e.g. a "via hole" or simply "via") formed in the insulating sheet 81 which includes inductive conductor 83. The ground electrode 82 functions as a shield electrode.

In the conventional LC filter 80, the inductive conductor 83 and the ground electrode 82 are not directly connected to each other. Therefore, the filter's performance is not degraded by signal current, noise or the like flowing from the inductive conductor 83 to the ground electrode 82. Other LC filters do include an inductive conductor and a ground electrode directly connected to each other. In such an LC filter, a current flows through the ground electrode such that the ground electrode functions as a shield electrode and also as a signal line. This reduces the shielding effect of the shielding electrode due to the occurrence of radiated noise and the like. Moreover, since a current path is formed in the ground electrode, the resultant inductance component of the ground electrode influences the filter characteristics.

SUMMARY OF THE INVENTION

In view of the above-described problems, an exemplary object of the present invention is to provide an LC resonant device which can limit the generation of radiated noise and has a higher Q-value than the conventional LC devices.

To achieve this and other objects, exemplary embodiments of the present invention provide an LC resonant device comprising an inductive conductor, at least one pair of capacitor electrodes, and a plurality of ground electrodes, wherein at least one of the plurality of ground electrodes is connected to the inductive conductor.

In exemplary LC resonant devices of the present invention, at least two of the plurality of ground electrodes can be electrically connected to each other. Further, in one embodiment, the inductive conductor and the pair of capacitor electrodes are disposed perpendicular to each other.

In the above-described arrangement, at least one of the plurality of ground electrodes is connected to the inductive conductor, and the ground electrode connected to the inductive conductor functions as a signal line while ground electrodes not connected to the inductive conductor function as shield electrodes.

If at least two of the plurality of ground electrodes are electrically connected to each other, the current capacity of the ground electrodes is increased and the total of the inductance components of the ground electrodes is reduced.

Further, if the inductive conductor and the pair of capacitor electrodes are perpendicular to each other, the magnetic flux generated by a current through the inductive conductor is parallel to the capacitor electrodes, so that no eddy current is generated in the capacitor electrodes.

BRIEF DESCRIPTION OF THE DRAWINGS

Other objects and advantages of the present invention will become apparent from the following detailed description of preferred embodiments when read in conjunction with the accompanying drawings, wherein the elements have been identified by like reference numerals, and wherein:

FIG. 3 is a cross-sectional view taken along the line III—III of FIG. 2;

FIG. 4 is an electrical equivalent circuit diagram of the LC resonant device shown in FIG. 2;

FIG. 5 is an exploded perspective view of a second exemplary embodiment of the LC resonant device in accordance with the present invention;

FIG. 6 is a perspective view of an external appearance of the LC resonant device shown in FIG. 5;

FIG. 7 is a cross-sectional view taken along the line VII—VII of FIG. 6;

FIG. 9 is a perspective view of an external appearance of the LC resonant device shown in FIG. 8;

FIG. 10 is a cross-sectional view taken along the line X—X of FIG. 9.

DESCRIPTION OF THE PREFERRED EMBODIMENTS

Preferred embodiments of an LC resonant device in accordance with the present invention will now be described with reference to the accompanying drawings.

FIGS. 1 through 4

Figure 1:
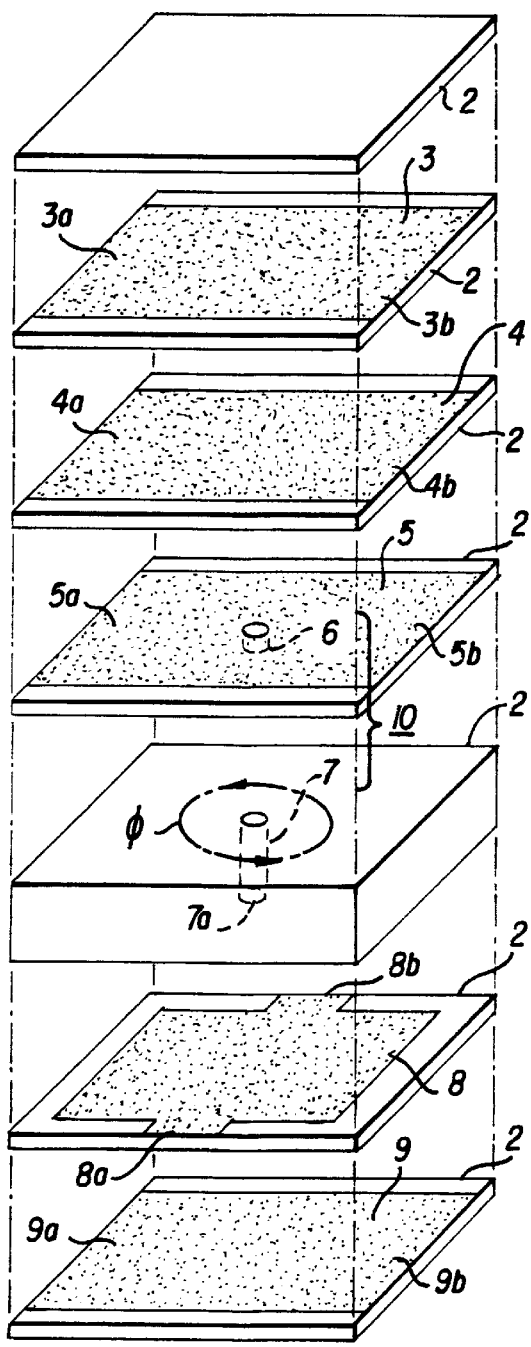
FIG. 1 is an exploded perspective view of a first exemplary embodiment of an LC resonant device in accordance with the present invention.

Referring to FIG. 1, a laminated type LC filter 1 has an insulating sheet 2 having a ground electrode 3 on its surface, an insulating sheet 2 having a ground electrode 4 on its surface, an insulating sheet 2 having a ground electrode 5 on its surface and having a through hole 6 formed in its central portion and connected to the ground electrode 5, an insulating sheet 2 having a through hole 7 formed in its central portion, an insulating sheet 2 having a capacitor electrode 8 on its surface, an insulating sheet 2 having a capacitor electrode 9 on its surface, and a cover insulating sheet 2.

Each of the insulating sheets 2 comprise, for example, a sheet formed of a material prepared by kneading together a dielectric powder and a magnetic power with a binder or the like. Each of the electrodes 3 to 5, 8, and 9 is formed, for example, of Ag, Pd, Cu, Au, Ag—Pd or other like material by printing or the like. Each of the through holes 6 and 7 is formed by filling a hole provided in the insulating sheet 2 beforehand with a conductive paste of, for example, Ag, Pd, Cu, Au, Ag—Pd or like material. The conductive through holes are formed before the sheet on which the through hole is formed becomes laminated with other sheets of the filter. The conductive through hole may comprise a solid conductor, or may include a conductor with one or more spaces formed therein.

The ground electrodes 3 to 5 have their respective end portions 3a, 3b, 4a, 4b, and 5a, and 5b exposed at the left and right sides of the sheets 2. (Henceforth, the terms "right", "left", "front" and "back" refer to the right, left, front and back of the LC resonant device as graphically depicted in the Figures.) The through hole 6 is aligned with and connected to the through hole 7 to form an inductive conductor 10 in cooperation with the through hole 7. A lower end surface 7a of the through hole 7 is connected directly to a central portion of the capacitor electrode 8. According to one exemplary embodiment, the through hole 7 is longer in the axial direction than in the radial direction and is formed in the sheet 2 so that its axial direction is parallel to the direction of the thickness of the sheet 2. However, other methods can be used to form the through hole 7. For example, the through hole can be created by forming a through hole in each of a plurality of thin sheets and superposing these sheets to align the through holes.

The capacitor electrode 8 has its end portions 8a and 8b exposed at the front and rear sides of the sheet 2. The capacitor electrode 9 mated with the capacitor electrode 8 includes end portions 9a and 9b which are exposed at the left and right sides of the sheet 2.

Figure 2:
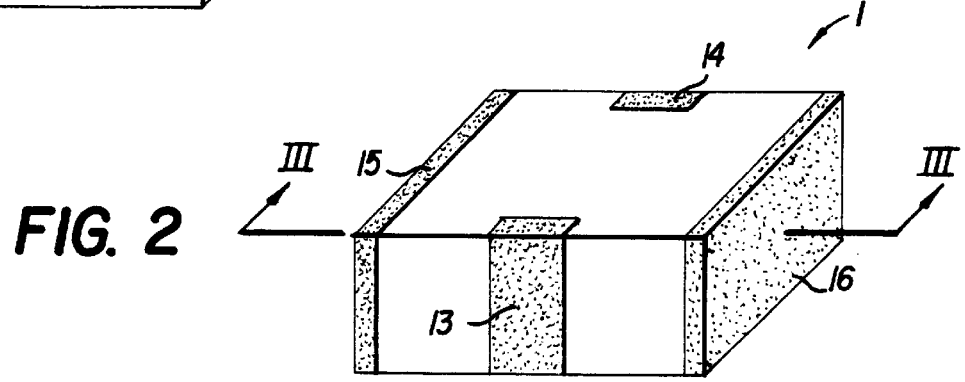
FIG. 2 is a perspective view of an external appearance of the LC resonant device shown in FIG. 1.
Figure 11:
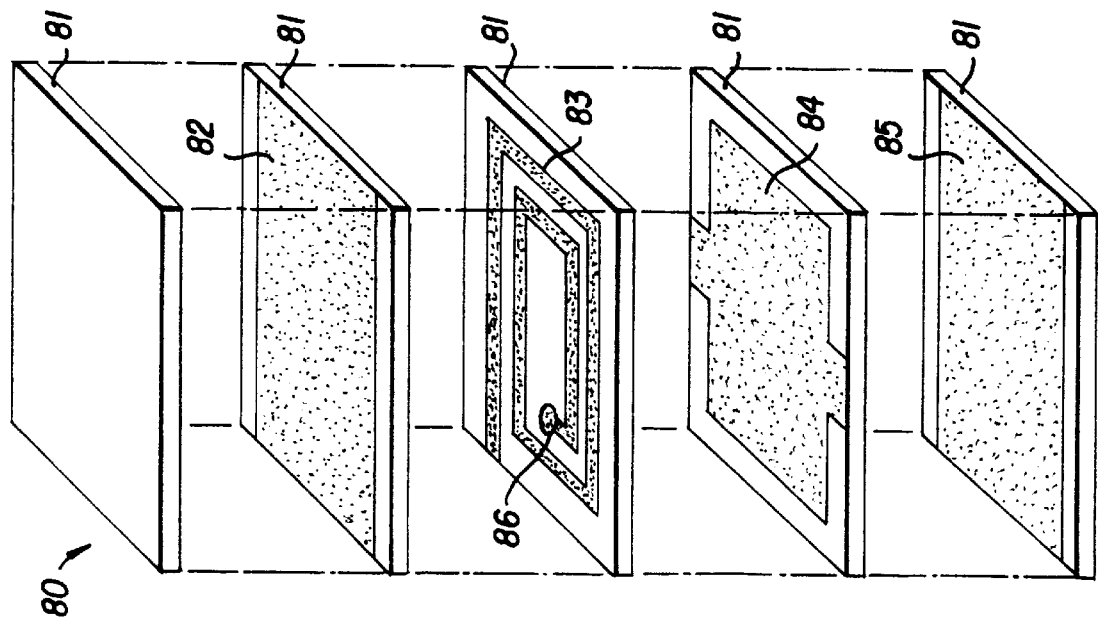
FIG. 11 is an exploded perspective view of a conventional LC resonant device.

The sheets 2 are laid on one another and are thereafter sintered to integrally form a laminated body. Next, as shown in FIGS. 2 and 3, external input/output electrodes 13 and 14 are formed on the front and rear side surfaces of the laminated body, and external ground terminals 15 and 16 are formed on the left and right side surfaces of the laminated body. The external electrodes 13 to 16 are formed by sintering, sputtering, deposition or the like. The end portions 8a and 8b of the capacitor electrode 8 are connected to the external input/output electrodes 13 and 14, respectively. The end portions 3a to 5a of the ground electrodes 3 to 5, and the end portion 9a of the capacitor electrode 9 are connected to the external ground electrode 15, and the end portions 3b to 5b of the ground electrodes 3 to 5 and the end portion 9b of the capacitor electrode 9 are connected to the external ground electrode 16.

In the LC filter thus obtained, the inductance of the inductive conductor 10 formed by the through holes 6 and 7 and the capacitance created between the capacitor electrodes 8 and 9 are combined to form an LC parallel resonator circuit such as shown in FIG. 4.

In the LC filter 1 constructed as described above, the ground electrode 5 (of the three ground electrodes 3 to 5), connected directly to the inductive conductor 10, functions as a signal line while the ground electrodes 3 and 4 which are not directly connected to the inductive conductor 10 function as shield electrodes. That is, a substantial portion of a signal's current, noise or the like flows through the ground electrode 5, while the ground electrodes 3 and 4 function so as to limit radiated noise. Thus, the LC filter 1 effectively limits the generation of radiated noise.

When a current flows through the inductive conductor 10, a magnetic flux $\phi$ is generated around the inductive conductor 10 which circulates along a plane perpendicular to the axial direction of the inductive conductor 10. However, since the inductive conductor 10 and the capacitor electrodes 8 and 9 are disposed perpendicular to each other, the magnetic flux $\phi$ does not penetrate the capacitor electrodes 8 and 9, so that no eddy current is caused in the capacitor electrodes 8 and 9. Therefore, the LC filter 1 has a high Q-value and a reduced eddy current loss. Moreover, since the inductive conductor 10 and the capacitor electrode 8 are directly connected without a connecting conductor, the filter is free from the influence of the inductance component of a connecting conductor and consequently has good spurious characteristics.

Further, because the inductive conductor 10 is connected to a central portion of the capacitor electrode 8, the influence of the inductance component of the capacitor electrode 8 can be minimized, thereby achieving a further improvement in the spurious characteristics of the device.

FIGS. 5 through 7

Referring to FIGS. 5 through 7, an LC filter 21 which represents a second embodiment of the present invention has a similar structure to that of the LC filter 1 of the first embodiment except that two groups of through holes 22 and 23 are respectively formed in the insulating sheets 2 having electrodes 3 and 4 thereon. Each of the through holes 22 and 23 are arranged at predetermined intervals, and the through holes 22 and the respective through holes 23 are aligned and connected with each other when the sheets 2 are superposed. Of the five through holes 23, the through hole 23 positioned at a center of the sheet 2 has its lower end surface 23a connected directly to the upper end surface 6a of the through hole 6. The other through holes 23 have their lower end surfaces 23a connected directly to the surface of the ground electrode 5. The through holes 22 and 23 connect the ground electrodes 3, 4 and 5 to increase the current capacity thereof, thereby reducing the total of the inductance components of the ground electrodes, 3, 4 and 5. Consequently, the LC filter 21 has the same advantages as the above-described filter 1 of the first embodiment and additionally has a higher Q-value than the device of FIG. 1, and can better reduce radiated noise compared to the device of FIG. 1.

Figure 8:
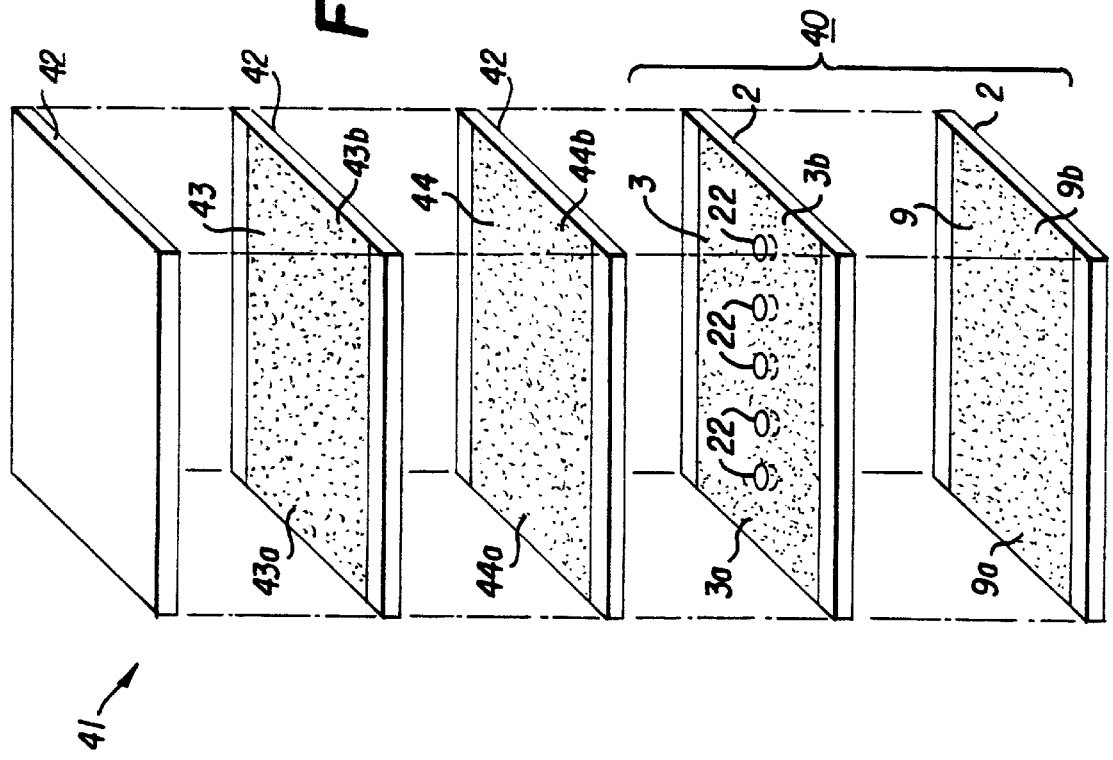
FIG. 8 is an exploded perspective view of a third exemplary embodiment of the LC resonant device in accordance with the present invention.

FIGS. 8 through 10

Referring to FIG. 8, an LC filter 41 which represents a third embodiment of the present invention is formed by providing insulating sheets 42 respectively having ground electrodes 43 and 44 on their surfaces and a cover insulating sheet 42 on the upper surface of the structure of the second embodiment indicated by 40 in FIG. 5. The ground electrodes 43 and 44 have their respective end portions 43a, 43b, 44a and 44b exposed at the left and right sides of the sheets 42.

The sheets 2 and 42 are laid on one another and are thereafter sintered to integrally form a laminated body. Next, as shown in FIGS. 9 and 10, external input/output electrodes 50 and 51 are formed on front and rear side surfaces of the laminated body, and external ground terminals 52 and 53 are formed on left and right side surfaces of the laminated body. The end portions 8a and 8b of the capacitor electrode 8 are connected to the external input/output electrodes 50 and 51, respectively. The end portions 3a to 5a, 43a, and 44a of the ground electrodes 3 to 5, 43, and 44 and the end portion 9a of the capacitor electrode 9 are connected to the external ground electrode 52, and the end portions 3b to 5b, 43b, and 44b of the ground electrodes 3 to 5, 43, and 44 and the end portion 9b of the capacitor electrode 9 are connected to the external ground electrode 53.

In the LC filter 41 constructed as described above, the ground electrodes 3 to 5 (of the five ground electrodes 3 to 5, 43, and 44) are connected to the inductive conductor 10 by the through holes 22 and 23 and therefore function as a signal line, while the ground electrodes 43 and 44 which are not connected to the inductive conductor 10 function as shield electrodes. That is, a substantial portion of a signal's current, noise or the like flows through the ground electrodes 3 to 5 while the ground electrodes 43 and 44 function so as to limit radiated noise.

In the LC filter 41 of the third embodiment, the shielding effect is improved by the addition of ground electrodes 43 and 44 which are not connected to the inductive conductor 10. Thus, the LC filter 41 is more effective in reducing radiating noise compared to filter 21 of the second embodiment, while otherwise having the same advantages as the second embodiment.

Other Embodiments

The LC resonant device of the present invention is not limited to the above-described embodiments and can be modified in various ways without departing from the scope of the invention.

The present discussion has been framed in the context of a parallel LC resonance circuit. However, it will be apparent to those skilled in the art that the principles described herein are applicable to other circuit configurations, such as resonant devices forming a serial LC resonance circuit.

The number of ground electrodes can be increased or decreased. Including more electrodes proportionally increases the effectiveness of the device in limiting radiated noise. Furthermore, the electrodes can be constructed in a variety of different shapes.

In the above-described embodiments, insulating sheets are laid on one another and sintered together to form an integral body. However, other manufacturing methods can be used. For example, previously sintered sheets can be used. Also, an LC component device can be manufactured by a method described below. A paste-like insulating material is applied by printing or the like and is dried to form a film. Thereafter, a paste-like conductive material is applied on the surface of the insulating material film and dried to form a capacitor electrode or an inductive conductor. Additional layers of film with conductive material formed thereon can then be successively added to obtain a resonant device having a laminated structure.

According to the present invention, at least one of a plurality of ground electrodes is connected to the inductive conductor, and a signal's current, noise or the like flows through the ground electrode connected to the inductive conductor, while the ground electrode not connected to the inductive conductor functions to limit radiated noise. An LC resonant device which effectively limits the generation of radiated noise is therefore obtained.

Also, at least two of a plurality of ground electrodes can be electrically connected to each other to increase the current capacity of the ground electrodes. The total inductance components of the ground electrodes can be thereby reduced to improve the Q-value. Further, the inductive conductor and the capacitor electrodes are disposed perpendicular to each other, so that the magnetic flux generated by a current through the inductive conductor does not penetrate the capacitor electrodes. As a result, an LC resonant device having a smaller eddy current loss and a higher Q-value can be obtained.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An LC resonant device comprising:
   an inductive conductor formed by a via hole provided in at least one sheet, wherein the via hole is filled with a conductive material;
   at least one pair of capacitor electrodes; and
   a plurality of ground electrodes,
   wherein one end of the inductive conductor is directly connected to at least one of said plurality of ground electrodes, and the other end of said inductive conductor is connected to one electrode of at said least one pair of capacitor electrodes.

2. An LC resonant device according to claim 1, wherein at least two of said plurality of ground electrodes are electrically connected to each other.

3. An LC resonant device according to claim 1, wherein said inductive conductor and said pair of capacitor electrodes are disposed perpendicular to each other.

4. An LC resonant device according to claim 2, wherein said inductive conductor and said pair of capacitor electrodes are disposed perpendicular to each other.

5. An LC resonant device according to claim 1, further comprising:
   a plurality of external electrodes formed on an outside surface of said device.

6. An LC resonant device according to claim 1, wherein said plurality of ground electrodes are formed on a plurality of respective sheets which are disposed adjacent to each other.

7. An LC resonant device according to claim 6, wherein at least two of said plurality of ground electrodes are connected together by at least one via hole formed in at least one of said respective sheets.

8. An LC resonant device according to claim 7, wherein said at least one via hole which connects said two of said plurality of ground electrodes together comprises plural via holes, wherein one of said plural via holes is directly connected to said inductive conductor.

9. An LC resonant device according to claim 7, further comprising at least one other ground electrode which is not directly connected to other ground electrodes by via holes.

10. The LC resonant device according to claim 1, wherein said inductive conductor is longer in its axial direction than in the radial direction and is formed in said at least one sheet so that its axial direction is parallel to the direction of the thickness of the sheet, and the axial direction is perpendicular to the planes defined by respective surfaces of said ground electrodes and said capacitor electrodes.

11. An LC resonant device according to claim 1, wherein said ends of said inductive conductor are connected to central portions of said at least one of said plurality of ground electrodes and said one electrode of said at least one pair of capacitor electrodes, respectively.

12. An LC resonant device comprising:
    at least one pair of capacitor electrodes comprising a first and second capacitor electrode;
    a plurality of ground electrodes including at least a first ground electrode and a second ground electrode; and
    an inductive conductor having a first end and a second end, wherein said first end connects with said first capacitor electrode and said second end directly connects with said first ground electrode, said inductive conductor being formed by a via hole provided in at least one sheet, wherein the via hole is filled with a conductive material.

13. An LC resonant device according to claim 12, further comprising:

a first external electrode and a second external electrode connected to each of said plurality of ground electrodes, and connected to said second capacitor electrode; and a third external electrode and a fourth external electrode connected to said first capacitor electrode.

14. An LC resonant device of claim 12, further comprising:

at least one connector for connecting said first ground electrode with said second ground electrode.

15. An LC resonant device of claim 14, further comprising:

a third ground electrode which is not directly connected to said inductive conductor.

16. An LC resonant device of claim 12, wherein said second ground electrode is not directly connected to said inductive conductor.

17. An LC resonant device of claim 12, wherein said inductive conductor is oriented in a direction which is perpendicular to a plane defined by a surface of said first capacitor electrode.

18. An LC resonant device according to claim 12, wherein said plurality of ground electrodes are formed on a plurality of respective sheets which are disposed adjacent to each other.

19. An LC resonant device according to claim 18, wherein at least two of said plurality of ground electrodes are connected together by at least one via hole formed in at least one of said respective sheets.

20. An LC resonant device according to claim 19, wherein said at least one via hole which connects said two of said plurality of ground electrodes together comprises plural via holes, wherein one of said plural via holes is directly connected to said inductive conductor.

21. The LC resonant device according to claim 12, wherein said inductive conductor is longer in its axial direction than in the radial direction and is formed in said at least one sheet so that its axial direction is parallel to the direction of the thickness of the sheet, and the axial direction is perpendicular to the planes defined by respective surfaces of said ground electrodes and said capacitor electrodes.

22. An LC resonant device according to claim 12, wherein said first end of said inductive conductor is connected to a central portion of said first capacitor electrode, and said second end of said inductive conductor is connected to a central portion of said first ground electrode.

* * * * *